US012656374B2

(12) United States Patent
Knierim et al.

(10) Patent No.: US 12,656,374 B2
(45) Date of Patent: Jun. 16, 2026

(54) SHUNT FOR USE IN BUSBAR-TO-MODULE CONNECTIONS

(71) Applicant: Tektronix, Inc., Beaverton, OR (US)

(72) Inventors: Daniel G. Knierim, Beaverton, OR (US); Julie A. Campbell, Beaverton, OR (US); David M. Ediger, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 128 days.

(21) Appl. No.: 18/198,800

(22) Filed: May 17, 2023

(65) Prior Publication Data

US 2023/0375596 A1 Nov. 23, 2023

Related U.S. Application Data

(60) Provisional application No. 63/400,831, filed on Aug. 25, 2022, provisional application No. 63/344,981, filed on May 23, 2022.

(51) Int. Cl.
*G01R 15/14* (2006.01)
*G01R 19/10* (2006.01)

(52) U.S. Cl.
CPC ........... *G01R 15/146* (2013.01); *G01R 19/10* (2013.01)

(58) Field of Classification Search
CPC .... G01R 15/146; G01R 19/10; G01R 1/0416; G01R 31/364; G01R 1/203
USPC ........................................................ 324/127
See application file for complete search history.

(56) References Cited

U.S. PATENT DOCUMENTS

| | | | | |
|---|---|---|---|---|
| 2018/0356446 A1* | 12/2018 | Yoon | | G01R 1/203 |
| 2020/0025802 A1* | 1/2020 | Endo | | H01C 1/14 |
| 2020/0182914 A1* | 6/2020 | Endo | | G01R 31/364 |
| 2020/0292588 A1* | 9/2020 | Mueller | | G01R 19/0092 |
| 2021/0048454 A1* | 2/2021 | Choi | | G01R 1/203 |
| 2023/0021547 A1* | 1/2023 | Muehlhausen | | G01R 1/203 |

FOREIGN PATENT DOCUMENTS

| | | | | |
|---|---|---|---|---|
| FR | 3091928 A1 * | 7/2020 | | G01P 15/09 |
| WO | WO-2021111951 A1 * | 6/2021 | | |

* cited by examiner

*Primary Examiner* — Arleen M Vazquez
*Assistant Examiner* — Robert P Alejnikov, Jr.
(74) *Attorney, Agent, or Firm* — Miller Nash LLP; Andrew J. Harrington

(57) ABSTRACT

A test and measurement accessory has a shunt configured to be located in a current path between a busbar and an electronic module and structured to minimize length added to the current path, the shunt having an opening extending through the shunt, and a resistive portion, the resistive portion configured to form a portion of the current path, and two or more contacts, at least one of the contacts extending through the opening and electrically insulated from the resistive portion of the shunt. A test and measurement accessory has a shunt, two or more contacts, at least one of the contacts extending through the opening, and a resistive portion comprising a plurality of resistors surrounding an insulative portion. A test and measurement accessory has a shunt including a washer having an opening, a resistive portion, and two or more contacts.

14 Claims, 10 Drawing Sheets

1000

1012

1030

1008

1020

1006

1002

SHUNT FOR USE IN BUSBAR-TO-MODULE CONNECTIONS

CROSS-REFERENCES TO RELATED APPLICATIONS

This disclosure claims benefit of U.S. Provisional Application No. 63/344,981, titled "COAXIAL SHUNT FOR USE IN BUSBAR-TO-MODULE CONNECTIONS," filed on May 23, 2022, and U.S. Provisional Application No. 63/400,831, titled "LOW INSERTION INDUCTANCE HIGH-POWER BUSBAR CURRENT SHUNT, filed on Aug. 25, 2022, the disclosures of both of which are incorporated herein by reference in their entirety.

TECHNICAL FIELD

The disclosure relates to current measurement, and, more particularly, to a shunt for high-power switching devices to allow current measurement with minimized electrical path length.

BACKGROUND

High-power switching devices are often built in module form, with screw terminals to connect with busbars for the high-current terminals. To support rapid current changes when switching transients, capacitor banks are usually mounted on the busbars, and usually close to the modules to minimize series inductance. This then leads to difficulties inserting a current measurement device between the capacitor bank and the module to measure the switching transients, as it may insert so much inductance as to change the transient being measured.

Various approaches have addressed this problem, but all have presented their own disadvantages. For instance, one solution employs Rogowski coils around the busbar. Rogowski coils lack DC capabilities, have limited bandwidth, and can present accuracy problems dependent on the position of the coil. Similarly, another solution uses current transformers around an extension post between the busbar and the module. However, current transformers may add inductance in addition to lacking DC capabilities and typically have limited bandwidth.

Another approach inserts a coaxial shunt into a gap in the busbar. Typically, these coaxial shunts have three concentric conductors in a cylindrical shape: a return path on the outside, a resistive shunt material in the middle, and a sense lead running through the innermost portion of the coaxial shunt. Such coaxial shunts constrain magnetic field between the outer and middle materials to cancel any inductance affecting the sense lead, and they allow for DC coupling and broad measurement bandwidth. But these shunts can be difficult to insert into gaps in busbars and can extend the electrical path such that unwanted inductance is inserted in the current path.

Configurations of the disclosed technology address shortcomings in the prior art.

DETAILED DESCRIPTION

Embodiments here involve a test and measurement accessory device including shunt structured to be inserted between a busbar and module. The accessory device enables measurement of a voltage drop across the shunt, and therefore, using the known resistance of the device, measurement of a current flowing between the busbar and the module. Some embodiments of the shunt are structured as a washer with a sense lead running through an inner portion, or opening, of the shunt. As discussed in further detail below, embodiments of the shunt minimize electrical path length and consequently minimize inductance inserted into the current path, while maintaining DC capabilities and broad measurement bandwidth benefits of traditional shunt resistors.

Figures 1A, 1B:
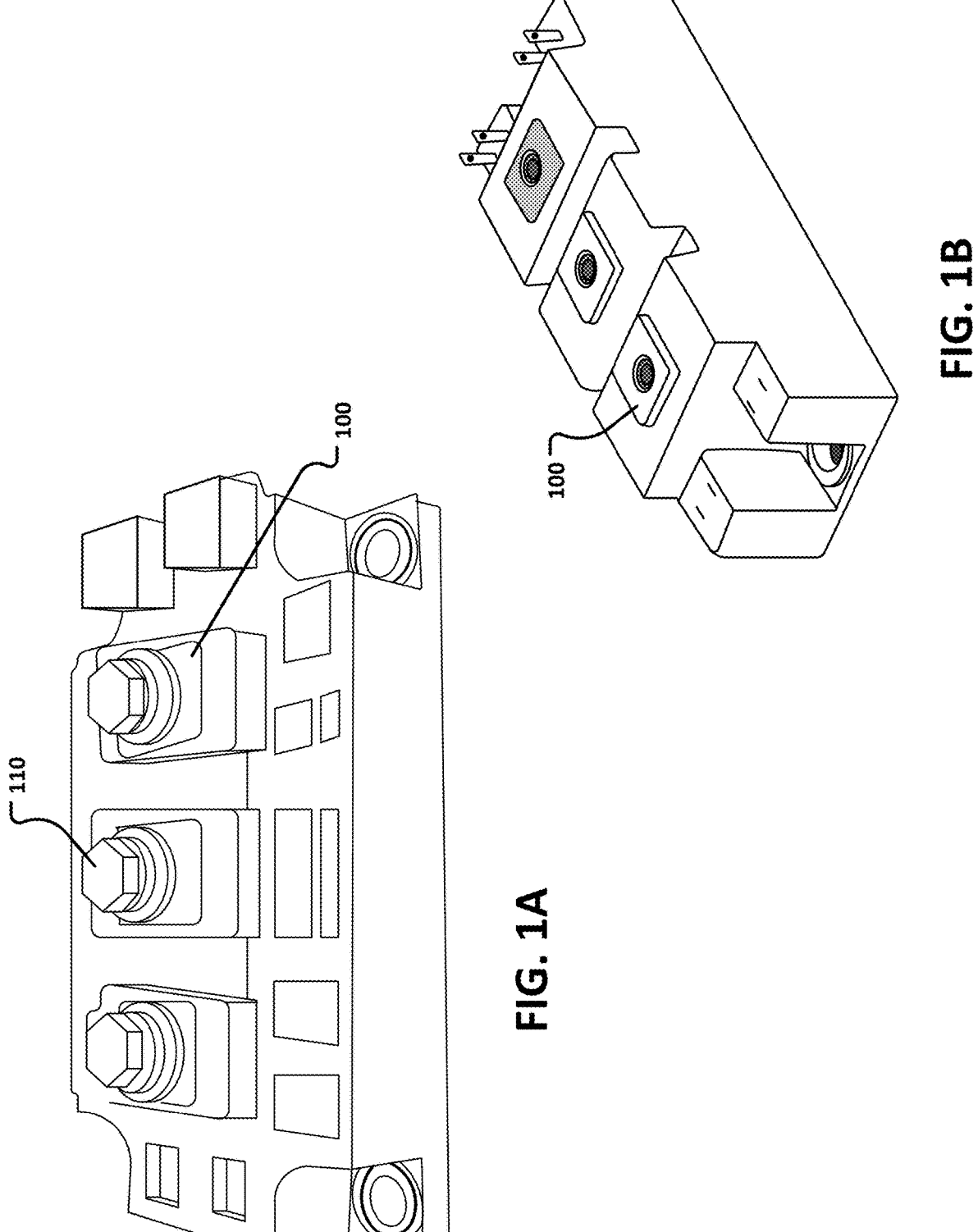
FIG. 1A shows a screw terminal of a switching device module.
FIG. 1B shows an additional example of a screw terminal of a switching device module.

FIGS. 1A and 1B show a module for a high-power switching device having a screw terminal 100 to connect the module to a busbar (not shown in FIGS. 1A and 1B). The screw terminal 100 includes a bolt 110 for mechanically attaching the busbar to the screw terminal 100 and for providing a current path between the module and the busbar. To support rapid current changes when switching transients, a capacitor bank may be mounted on the busbar, and it may be mounted close to the module to minimize series inductance. However, this may lead to difficulties inserting a current measurement device between the capacitor bank and the module to measure the switching transients, as it may insert so much inductance as to change the transient being measured.

Figure 2:
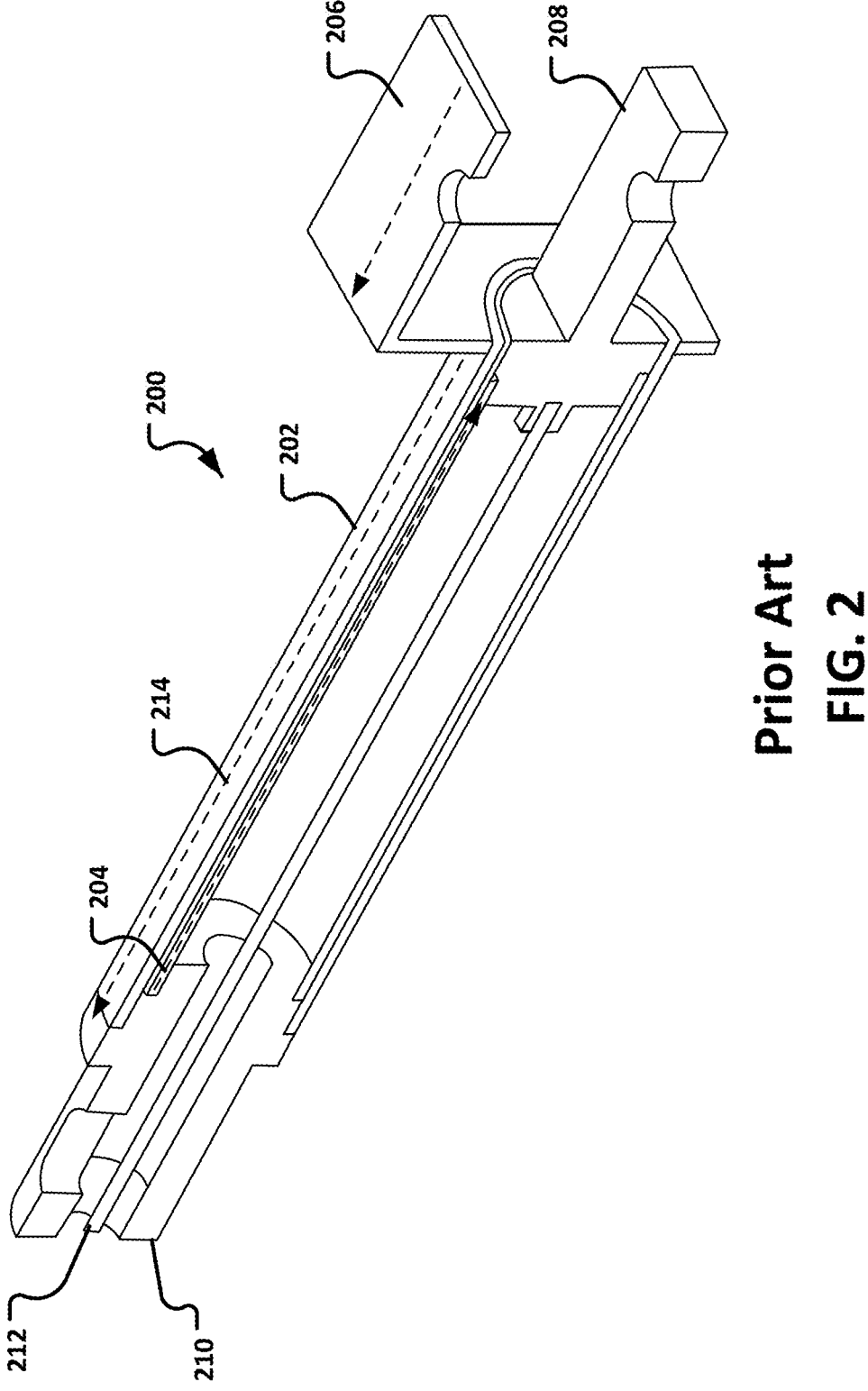
FIG. 2 shows an example of a conventional coaxial shunt.

FIG. 2 shows a cross section of an example of a conventional coaxial shunt 200 used to measure a voltage drop across the shunt. The shunt comprises coaxial cylinders. An outer cylinder 202 will typically consist of copper, and the inner cylinder 204 made of manganin. The pins 206 and 208 are current pins, and pins 210 and 212 are the voltage pins. The center pin or sense lead 212 is in the center of the coaxial shunt. An issue that arises with this type of structure lies in the current path. The current flows along the line shown at 214 through the current pin 206 and along the outer cylinder 202. This relatively long current path adds to the overall electrical path length of the circuit or device being measured. This inserts inductance into the path, which may change the transient being measured. As discussed below, the embodiments here minimize any length added to the current path.

Figure 3:
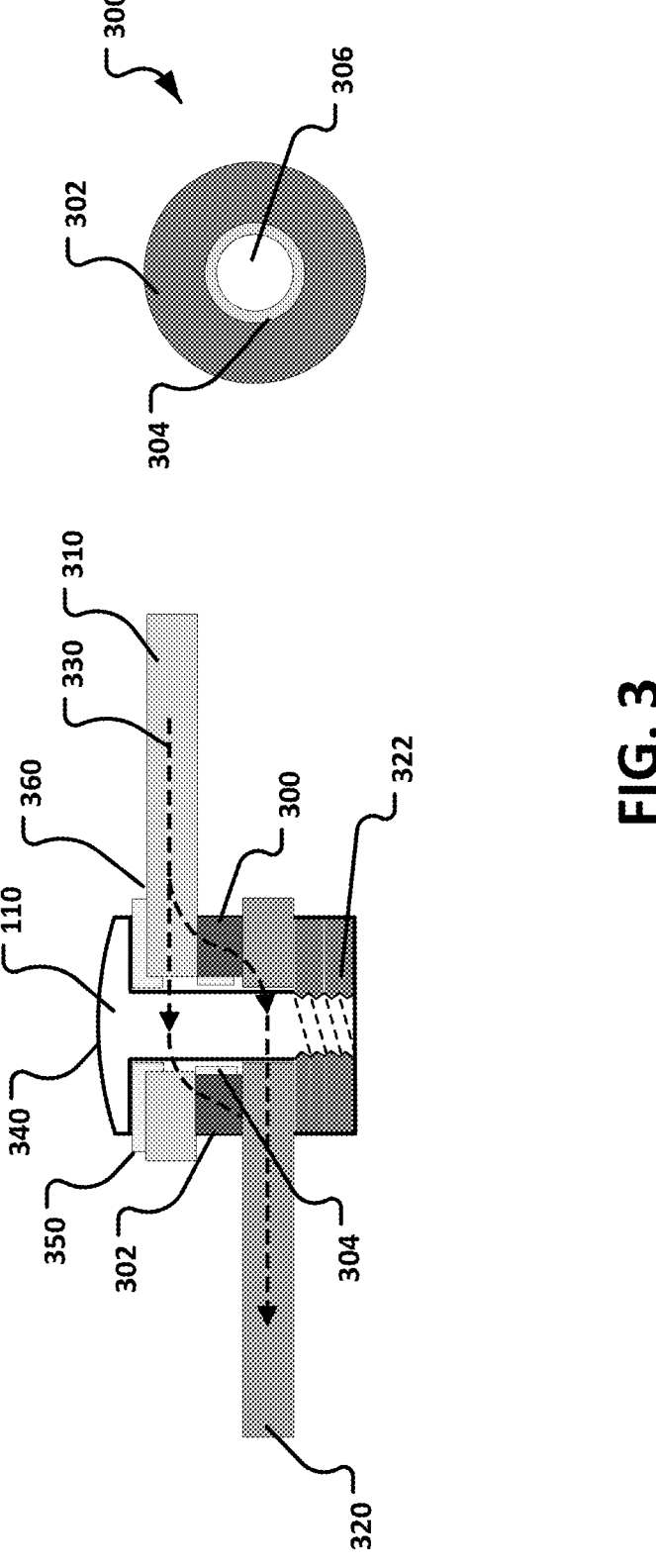
FIG. 3 shows a cross sectional view of a busbar and module connection with an embodiment of a shunt as inserted.

FIG. 3 shows a test and measurement accessory comprising a shunt 300 to be inserted between a busbar 310 and a screw terminal 320 of an electronic module, such as the modules shown in FIGS. 1A and 1B. The screw terminal 320 may be an example of, or similar to, the screw terminal 100 show in FIGS. 1A and 1B but is shown elongated in FIG. 3 to better illustrate the current path through the assembled components. The shunt 300 includes an opening 306, such as a hole that extends through the shunt. An embodiment of the shunt 300 is shaped such that it resembles a washer. The shunt 300, with its washer-like shape, includes a resistive portion 302, and may also include an insulative portion 304 in some embodiments.

In some embodiments, the resistive portion 302 surrounds the insulative portion 304, creating outer and inner layers of the shunt 300. The shunt 300 may be between the screw terminal 320 and the busbar 310 and provides a current path 330 between the busbar 310 and screw terminal 320 of the electronic module through the shunt 300. Specifically, the resistive portion 302 of the shunt is configured to form a portion of the current path 330. A bolt 110 may then be inserted through the busbar 310 and through the opening 306 of shunt 300 and fastened into the threaded portion 322 of screw terminal 320. This secures the shunt 300 between the busbar 310 and the screw terminal 320 and creates good electrical contact between these components.

This bolt 110 may serve as one contact 340 for the shunt to allow sensing of the voltage at the "bottom" end of the shunt 300, the end of the shunt 300 contacting the screw terminal 320. A second contact may be located on or connected directly to busbar 310, for example at location 360, to sense the voltage at the "top" end of the shunt 300, the end of the shunt 300 contacting the busbar 310. The resistive portion 302 causes a voltage drop across the shunt 300, which can be measured at the first and second contacts. The measured voltage drop, together with the known resistance value of the shunt, can be used to determine the current flowing through the shunt, and therefore the current flowing between busbar 310 and screw terminal 320 of the module.

The bolt 110 extends through the opening 306 of the shunt to conveniently act as a sense lead and provide the contact 340 at the same "top" surface of the assembled accessory device as the second contact 360. The contact 340 and the bolt 110 are electrically insulated from the resistive portion 302 of the shunt. In some embodiments, an insulative portion 304 of the shunt 300 electrically insulates the contact 340 from the resistive portion 302. In some embodiments, an air gap electrically insulates the contact 340 from the resistive portion 302. However, without insulating layer 304 it may be more challenging to install shunt 300 and maintain an air gap to prevent the bolt 110 from shorting to the resistive portion 302 of the shunt 300 while tightening the bolt. Some embodiments include both an insulative portion 304 of the shunt and an air gap.

Figure 4:
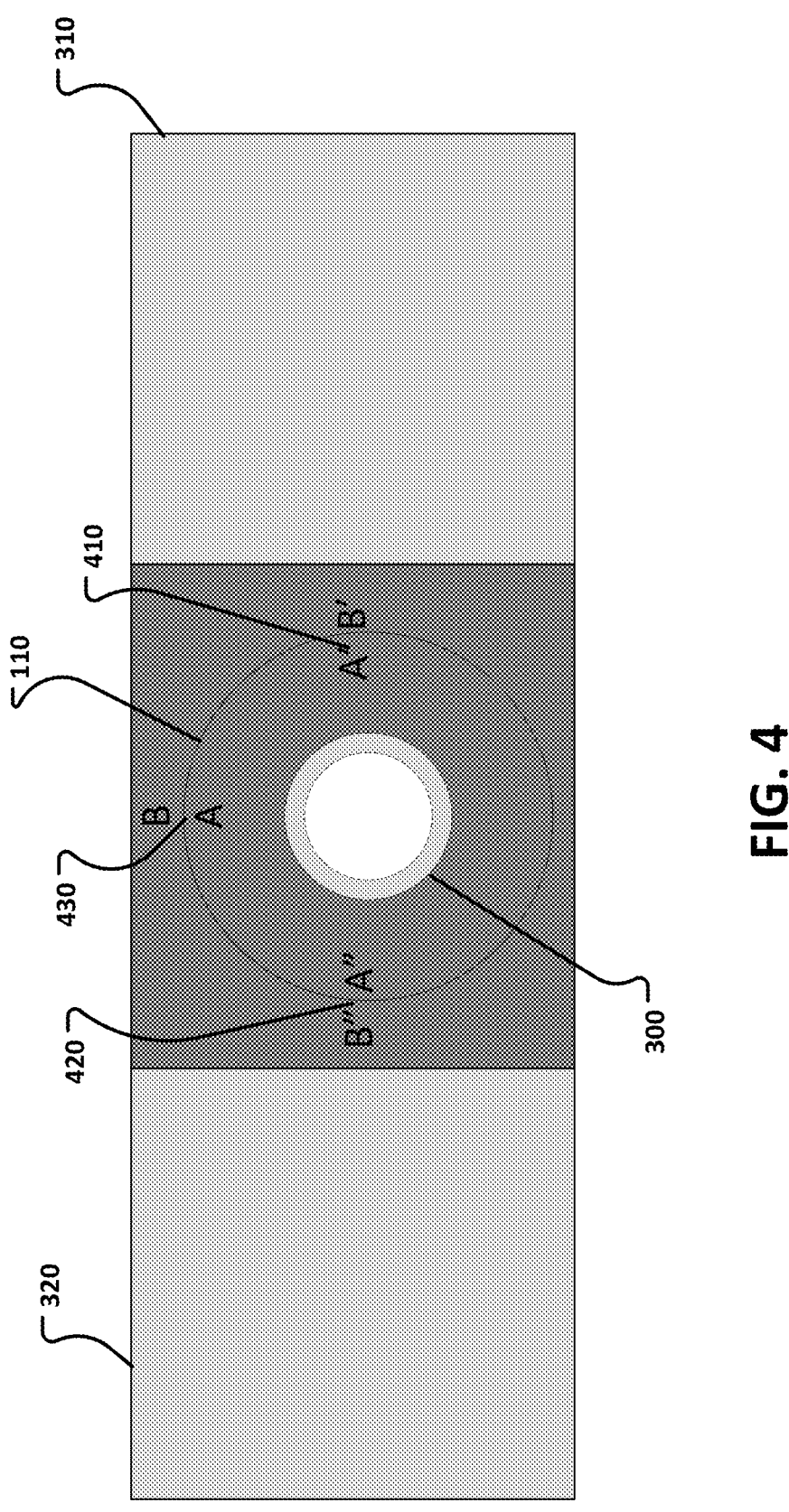
FIG. 4 shows a top view of the busbar and module connection of FIG. 3.

FIG. 4 shows a top view of the assembly of FIG. 3, in which the busbar 310 mechanically fastens to the screw terminal 320 of the electronic module, and between which the shunt 300 is inserted. As discussed, embodiments of the disclosure may utilize bolt 110 as one sense lead for the shunt 300 and busbar 310 as another sense lead, providing contact surfaces for taking measurements, e.g. by connecting cables, leads of a test probe, or other measurement leads of a test and measurement instrument. The contacts allow measurement of a voltage drop across the shunt that can later be converted to a current measurement. Measurement leads contacting the contact surfaces may nonetheless be sensitive to magnetic flux from the current flow through the busbar, as current crowding on the module side may cause some magnetic field to loop through bolt 110. Consequently, the specific location of the two or more contacts for the measurement leads on the contact surface of bolt 110 and busbar 310 may change the measurement due to the magnetic field looping through the bolt 110.

For instance, as illustrated in FIG. 4, measurement leads contacting bolt 110 and busbar 310 at a first location 410, represented with A' and B,' and a second location 420, represented with A" and B," may enclose some loop area sensitive to magnetic flux. The locations labeled with variations of A reside on the bolt, and the variations of B reside on the busbar 310. Because the polarity of the magnetic pickup will change between the measurement locations, a third measurement location 430, represented with A and B, may serve as an intermediate location that experiences a minimal magnetic pickup in the measurement leads. The specific location of this third measurement location 430 may depend on factors such as thickness of the shunt 300, shown as dashed lines because it lies under the top of the bolt and the busbar 310, and the specific current path in busbar 310 screw terminal 320 of the electronic module.

However, in general, embodiments will have first and second contacts 340, 360 of sufficient size to allow for some intermediate location for placement of the measurement leads that reduces effects of magnetic flux. Because the washer-like shape of the shunt 300 maintains a relatively flat profile, it minimizes the additional length of the current path from the shunt 300 compared to traditional shunt components. Minimizing the current path across shunt 300 in this way reduces the additional inductance being inserted into the current path. Accordingly, utilizing the shunt 300 and carefully placing measurement leads may minimize two potential sources of measurement error in high-power switching devices.

Figure 5:
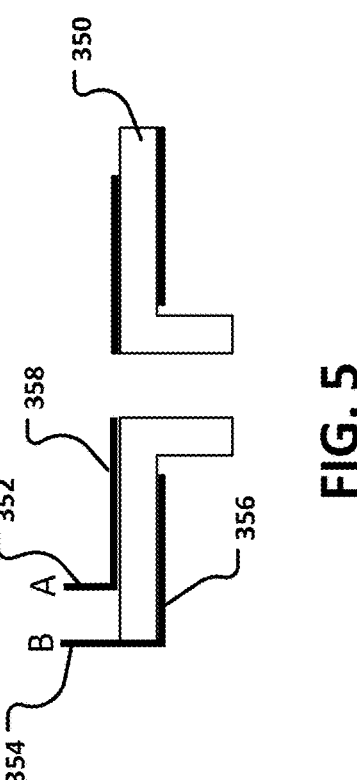
FIG. 5 shows a cross sectional view of a component of the shunt of FIG. 3.

Additionally, in embodiments of the shunt 300 shown in FIG. 3, an insulating shoulder washer 350 may be included. This insulating shoulder washer 350 may reside with the shunt 300 and may have a portion parallel to the busbar 310 to be placed between the bolt 110 and the busbar 310. As shown in FIG. 5, the insulating shoulder washer 350 may also include conductive portions 356 and 358 to contact the busbar 310 and bolt 110 from FIG. 3. The conductive portions 356 and 358 may comprise pins 352 and 354, represented with A and B in FIG. 5. Pins 352, 354 may provide connection locations for measuring a voltage between points A and B, which includes the voltage drop across the shunt 300 and the voltage drop due to the contact resistance of the shunt 300 to the busbar 310 above and screw terminal 320 below. The pins 352, 354, together with conductive portions 356, 358 and busbar 310 and bolt 110 form at least two contacts for measuring the voltage drop across the assembled components. Like the measurement locations described in relation to FIG. 4, a user may rotate the shoulder washer 350 to adjust the specific location of the pins 352 and 354 to minimize magnetic flux pickup before fully fastening the bolt 110 to the screw terminal 320. In both the examples of FIGS. 4 and 5, the optimum rotation location may be found experimentally by minimizing high frequency content in the measured voltage. The magnetic pickup (proportional to di/dt) is always in quadrature to the resistive drop, independent of polarity, and thus can only artificially increase high frequency content. Thus minimum high frequency content as a function of rotation coincides with zero magnetic pickup.

Figure 6:
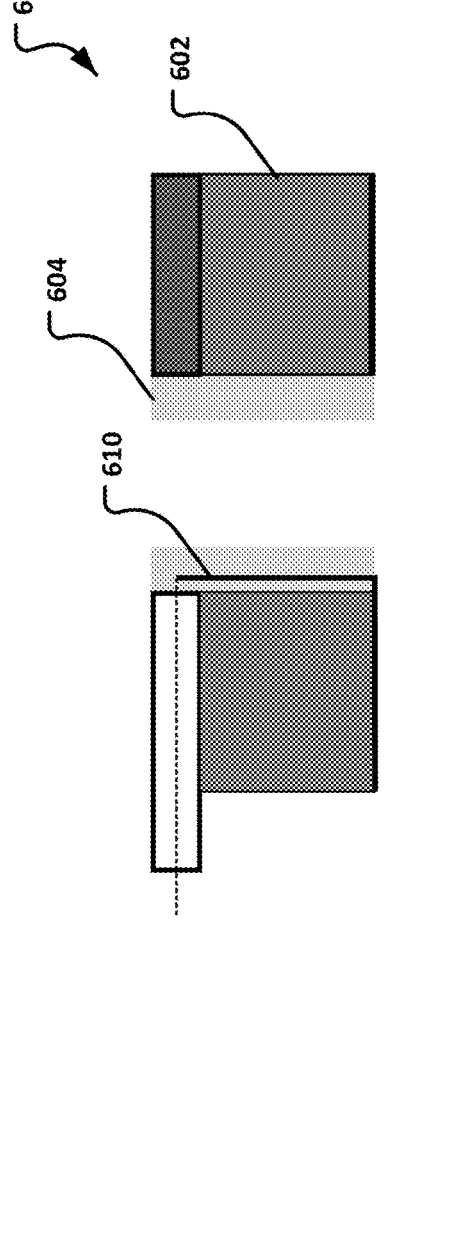
FIG. 6 shows a cross sectional view of another embodiment of a shunt.

FIG. 6 shows another example of shunt 600. The shunt 600 is similar to the shunt 300, including a resistive portion 602 and an insulative portion 604, but comprises a Kelvin sense configuration having a sense lead 610 on the shunt 600 itself. The sense lead 610 resides on an inner portion of the shunt 600, running parallel to the center axis of the shunt 600, for example, through the insulative portion 604. In this way, having the sense lead 610 on the shunt 600 itself may avoid measuring the voltage drop across the contact resistance between the shunt 600 and the busbar and module shown in FIG. 3. Additionally, running the sense lead 610 through an inner portion of the shunt 600 may minimize magnetic flux pickup.

The embodiments of a shunt here each have an opening through which one of the sense leads will extend. While this is like the current example of a shunt given above, the sense lead here is configured to be part of the current path such that length added to the current path is minimized, in contrast to the length of the current path shown in FIG. 2.

Figure 7:
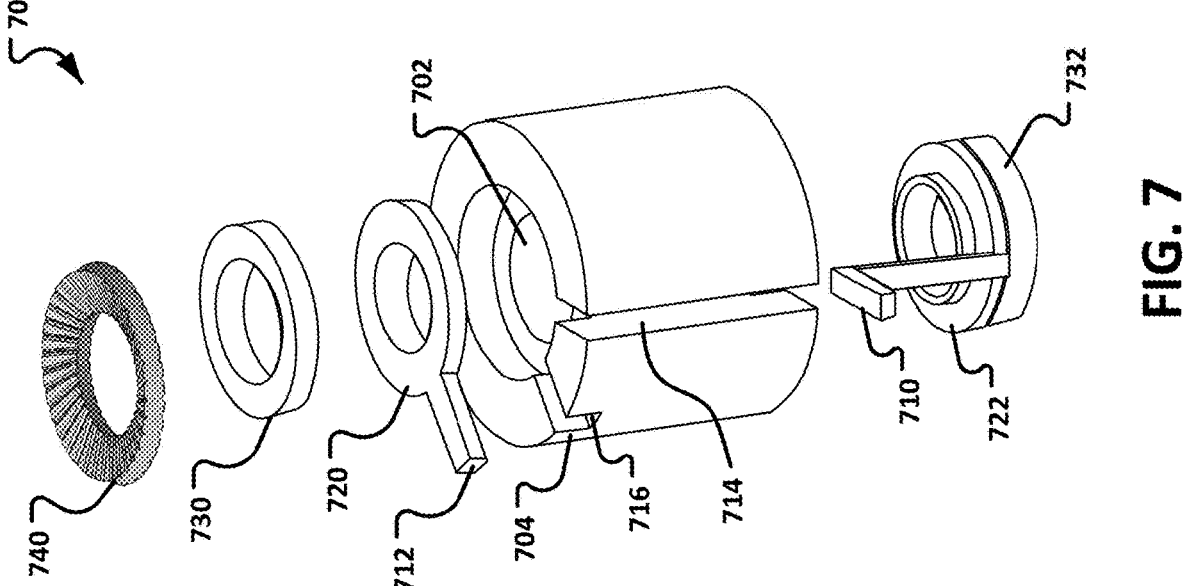
FIG. 7 shows an embodiment of a shunt.

FIG. 7 shows an embodiment of a shunt 700. In the embodiment, the shunt 700 may still include a resistive portion 702 and an insulative portion 704. The insulative portion 704 may comprise a ceramic washer, and the resistive portion 702 may comprise a resistive material on a surface of the ceramic washer, for example, painted on an inner surface of the ceramic washer as shown. One example material for the ceramic washer may be CoorsTek YTZP zirconia, but many other materials are also usable in embodiments to provide a structural substrate for the resistive material. First and second conductive elements 720 and 722 may also be included in embodiments, with the first conductive element 720 placed on a top surface of the ceramic washer that forms the insulative portion 704 and the second conductive element 722 placed on a bottom surface. Conductive elements 720, 722 may be formed of gold or other metals, for example, and may be electrically connected to the resistive portion 702 by solder or brazing, for example. Additionally, rather than the bolt of the screw terminal, not shown in FIG. 7, serving as the sense lead, a first sense lead 710 provides one contact for measurement leads and extends from the conductive element 722 on the bottom surface nearest the electronic module from FIGS. 1A and 1B to the top of shunt 700, nearest the busbar, shown in FIG. 3. The conductive material forming this sense lead contact 710 may be run vertically, parallel to a center axis of the shunt 700, but insulated from the painted circuit forming the resistive portion 702. In this way, the first sense lead extends through an opening in inner portion of the shunt 700. The sense lead 710 generally extends vertically through the thickness or height of the ceramic washer, although it is illustrated with an exaggerated height in FIG. 7.

A second sense lead 712 provides another contact, formed by extending a conductive material from the conductive element 720 on the top surface. The ceramic washer forming the insulative portion 704 may also include a first slot 714 and a second slot 716 for receiving the first sense lead 710 and the second sense lead 712, respectively. As illustrated, the conductive element 720 placed on the top surface of the ceramic washer that forms the insulative portion 704 may have a gap aligned with the slot 714, the gap preventing the sense lead 710 from contacting the top conductive element 720. By rotating the shunt 700, a user may position the first sense lead 710 and second sense lead 712 such that they experience minimal magnetic pickup from the magnetic field looping through the shunt 700.

The embodiment of FIG. 7 may also include at least one compressible conductive gasket 730. For instance, a compressible conductive gasket 730 may reside on a top surface of the top conductive element 720, between the shunt 700 and the busbar 310. An additional compressible conductive gasket 732 may reside on a bottom surface of the bottom conductive element 722, between the shunt 700 and the bottom of the screw terminal 320 of the electronic module. A compressible conductive gasket may reside in either of the configurations described above, or both, and may protect the shunt 700 from the compression force of the mechanical attachment such as the screw force of the screw terminal. Finally, the embodiment of FIG. 7 may include at least one conductive locking washer 740. Although FIG. 7 illustrates a single locking washer 740 placed at the top of the shunt 700, embodiments may have a locking washer on either the top or bottom, or both. Locking washer(s) may replace one or more of the compressible conductive gaskets.

Figures 8, 9:
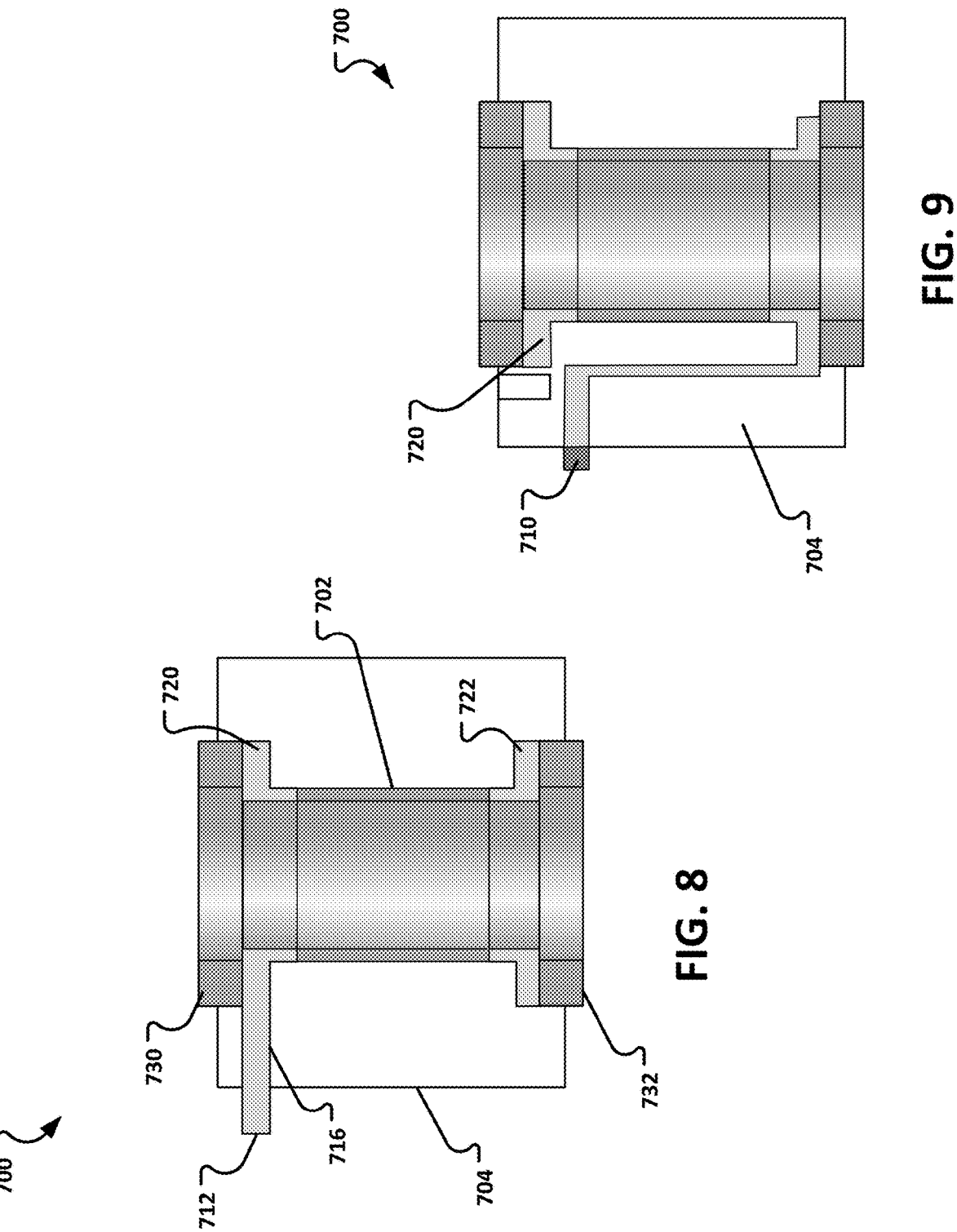
FIGS. 8 and 9 show alternative embodiments of a shunt.

FIG. 8 shows a cross sectional view of another embodiment of shunt 700. As shown, embodiments of the shunt 700 may be assembled with optional compressible conductive gaskets 730 and 732 on both the top and bottom surfaces of the shunt 700 to protect the insulative portion 704 from compressive force. Additionally, in embodiments, the second sense lead 712 connected to the top conductive element 720 may extend through a second slot 716 in the insulative portion 704 and out the side of the shunt 700. The first sense lead 710 from bottom conductive element 722 the is not visible in the illustrated cross section of FIG. 8, as the first sense lead 710 extends through the insulative portion 704 and out the side of the shunt 700 at a different circumferential position on the shunt 700 relative to the second sense lead 712. Put differently, in the view shown in FIG. 8, the first sense lead 710 resides in and exits from a portion of the shunt 700 hidden to illustrate the cross section.

FIG. 9 shows an rotated cross sectional view of the shunt 700. In this view, the first sense lead 710 exits through an opening in the insulative portion 704 to the side, separated from the top conductive element 720 by a portion of the insulative portion 704.

Figure 10B:
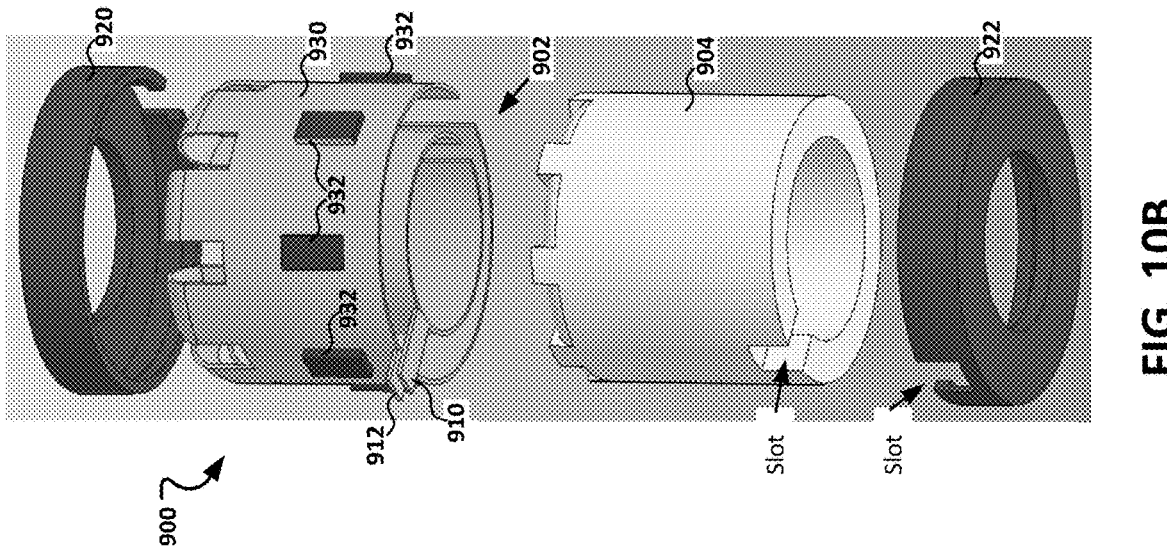
FIG. 10A and FIG. 10B show views of an embodiment of a shunt.
Figure 10A:
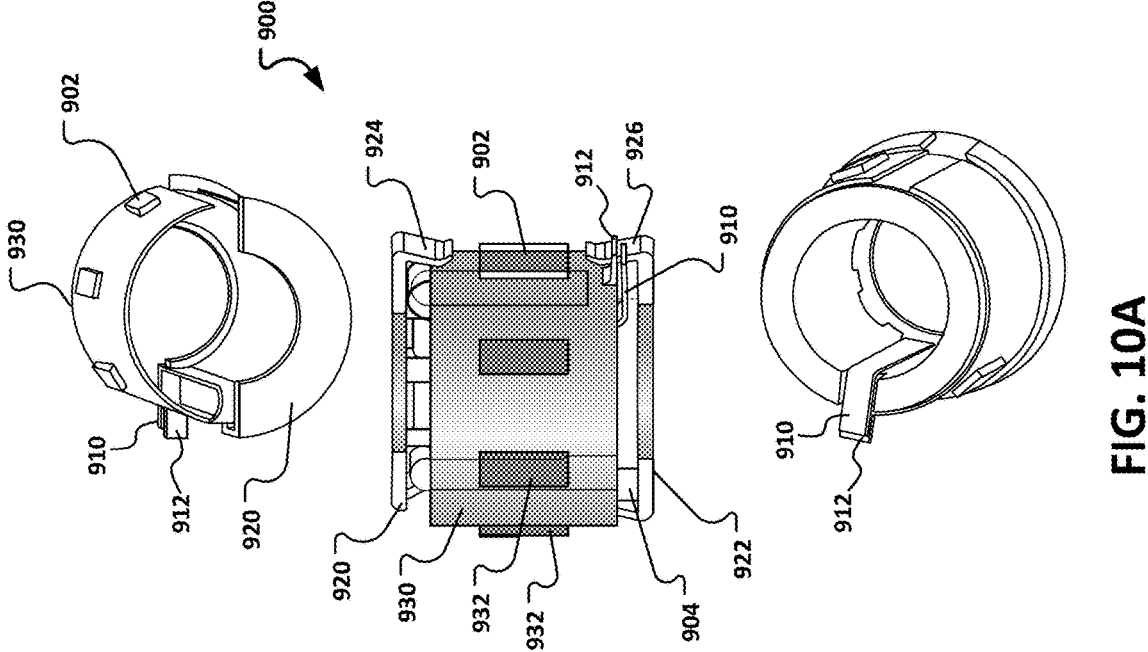

In another embodiment, shown in FIG. 10A and FIG. 10B, a shunt 900 comprises a resistive portion 902, formed of a plurality of resistors 932 mounted on a flex circuit 930, and an insulative portion 904. The resistive portion 902 may comprise an outer layer surrounding the insulative portion 904. According to this embodiment, conductive elements 920 and 922 may be placed on both the top and bottom surfaces of the shunt 900. Each conductive element may contact the insulative portion 904 for mechanical support and may contact the resistive portion 902 using one or more clips. For example, clip 924 extends from the conductive element 920 in the direction of the opposite conductive element 922, and clip 926 extends from the conductive element 922 in the direction of the conductive element 920. Each clip 924 or 926 has a structure to allow the conductive element, or caps, to contact the flex circuit 930 and provide a conductive path across the shunt 900 through the resistive portion 902. Additionally, each conductive element 920 or 922 may have a structure to share a center axis with the shunt 900 and may be rotated about the axis without the respective clip 924 or 926 losing contact with the flex circuit 930.

A first sense lead contact 910 may be provided, running from the bottom conductive element 922 through the inside of the opening of the shunt 900, and out a slot near the bottom of the shunt 900, shown in the view on the bottom right. In this embodiment, the sense leads may be fully built into the flex circuit. A second sense lead 912 may extend from the bottom of the resistive portion 902 near the bottom conductive element 922. By rotating the shunt 900, a user may position the first sense lead 910 and second sense lead 912 such that the measurement leads will experience minimal magnetic pickup from the magnetic field looping through the shunt 900.

Figure 11:
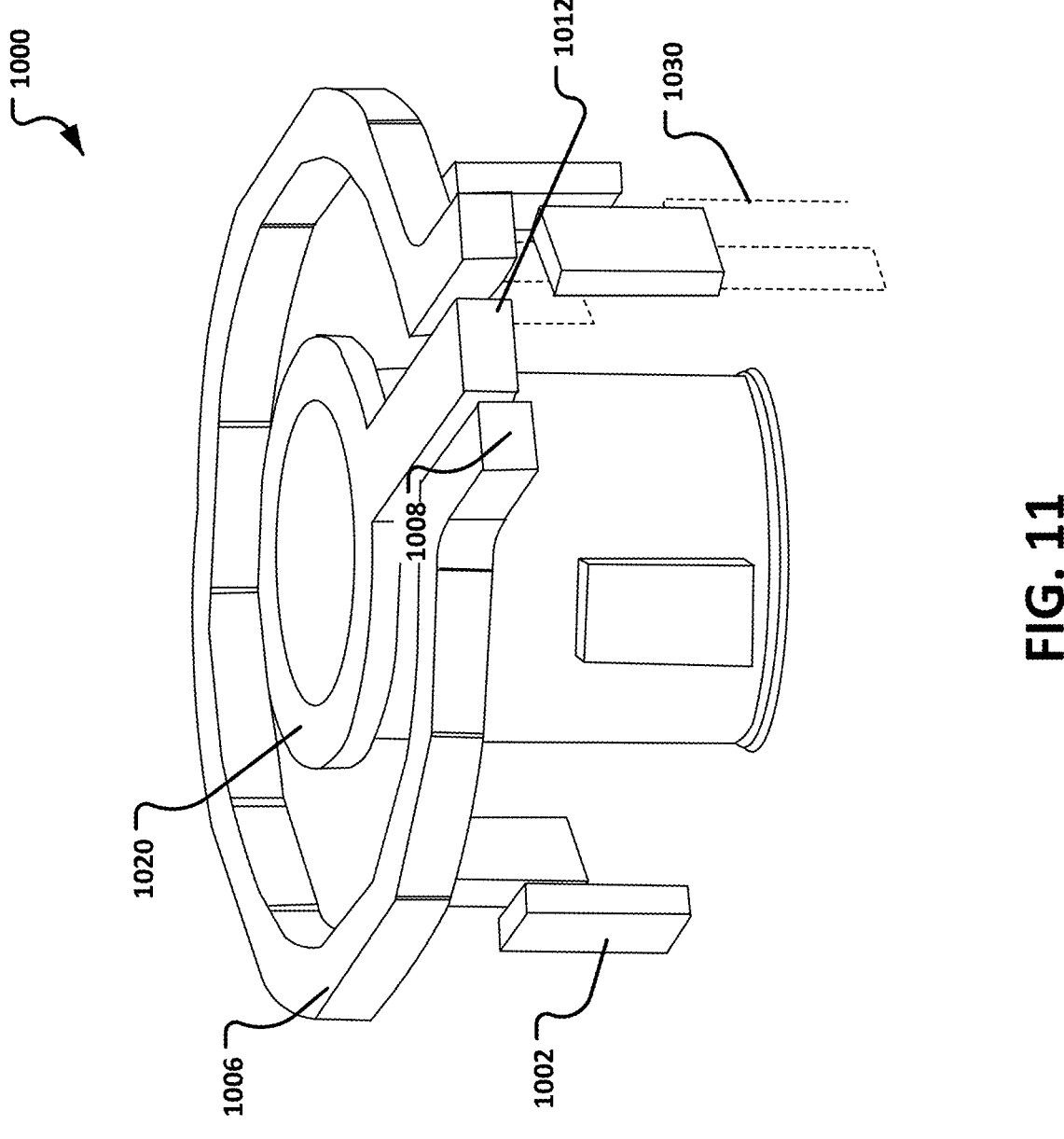
FIG. 11 shows a view of components of an embodiment of a shunt.
Figure 12:
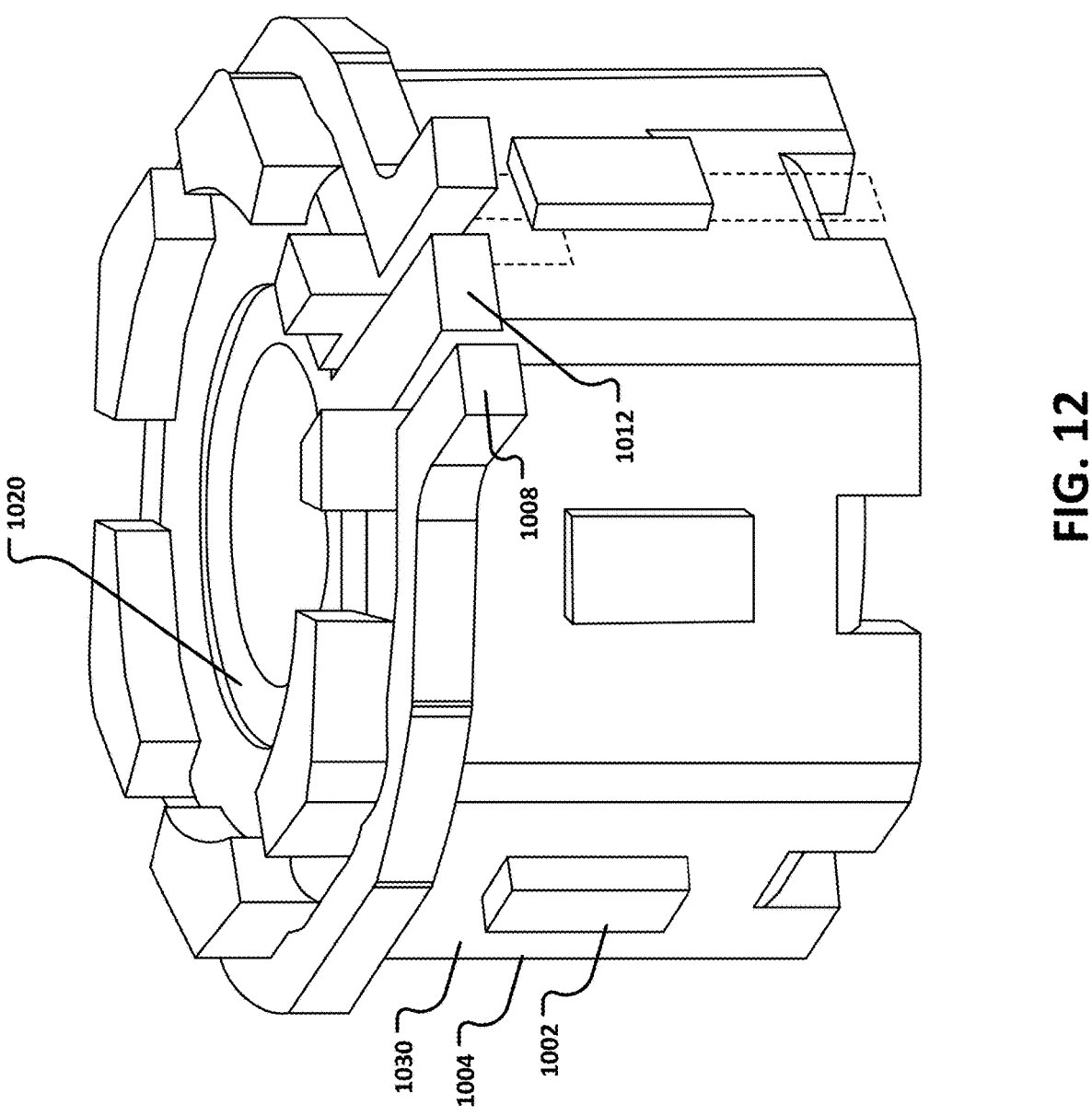
FIG. 12 shows a view of the shunt of FIG. 11.

FIGS. 11 and 12 illustrate another embodiment of a shunt 1000. FIG. 12 shows the ceramic insulative portion 1004, which provides a structural substrate for the shunt 1000, but in FIG. 11 it has been removed to show the sense line leads and the resistors. The conductive element 1020 connects to the high side of the resistive portion 1002 and has a sense lead portion 1012 as one of the contacts. The resistive portion 1002 in this embodiment comprises resistors that may have a circuit 1030. The hexagonal conductive element 1006 electrically connects to the low side of the resistors and has a second sense lead such as 1008, that extends up through the opening on the inside of the shunt 100, and that comes out on either side of the other sense lead 1012. FIG. 12 shows the assembly with the insulative portion 1004 comprising a ceramic washer upon which the resistors 1002 and circuit 1030 reside. The resistors and circuit may be painted on the exterior of the ceramic washer body 1004. By rotating the shunt 1000, a user may position the sense leads such that they experience minimal magnetic pickup from the magnetic field looping through the shunt 1000.

In this manner, the embodiments provide a test and measurement accessory for measurement of voltage in a current path between a busbar and a module without contributing much inductance to the measurement. The accessory comprises a shunt having an opening through which one of the sense leads extends. The shunt allows for measurement of a voltage drop across the shunt to be converted to a current measurement, while minimizing any additional path length that may affect the measurement.

The previously described versions of the disclosed subject matter have many advantages that were either described or would be apparent to a person of ordinary skill. Even so, all these advantages or features are not required in all versions of the disclosed apparatus, systems, or methods.

Additionally, this written description refers to particular features. It is to be understood that the disclosure in this specification includes all possible combinations of those particular features. For example, where a particular feature is disclosed in the context of a particular example configuration, that feature can also be used, to the extent possible, in the context of other example configurations.

Also, when reference is made in this application to a method having two or more defined steps or operations, the defined steps or operations can be carried out in any order or simultaneously, unless the context excludes those possibilities.

Furthermore, the term "comprises" and its grammatical equivalents are used in this application to mean that other components, features, steps, processes, operations, etc., are optionally present. For example, an article "comprising" or "which comprises" components A, B, and C can contain only components A, B, and C, or it can contain components A, B, and C along with one or more other components.

Also, directions such as "vertical," "horizontal," "right," and "left" are used for convenience and in reference to the views provided in figures. But the shunt may have a number of orientations in actual use. Thus, a feature that is vertical, horizontal, to the right, or to the left in the figures may not have that same orientation or direction in actual use.

EXAMPLES

Illustrative examples of the disclosed technologies are provided below. An embodiment of the technologies may include one or more, and any combination of, the examples described below.

Example 1 is a test and measurement accessory, comprising: a shunt configured to be located in a current path between a busbar and an electronic module and structured to minimize length added to the current path, the shunt having an opening extending through the shunt, and a resistive portion, the resistive portion configured to form a portion of the current path; and two or more contacts to allow measurement of a voltage drop across the shunt, at least one of the contacts extending through the opening and electrically insulated from the resistive portion of the shunt.

Example 2 is the test and measurement accessory of Example 1, further comprising an insulating washer between the shunt and at least one of the two or more contacts.

Example 3 is the test and measurement accessory of Examples 2, wherein the insulating washer includes conductive portions that form a pair of voltage sense leads with the two or more contacts.

Example 4 is the test and measurement accessory of any of Examples 1 through 3, wherein the at least one of the contacts is insulated from the resistive portion of the shunt by at least one of an insulative portion of the shunt and an air gap.

Example 5 is the test and measurement accessory of any of Examples 1 through 4, wherein the at least one of the contacts extending through the hole comprises a bolt of the busbar.

Example 6 is the test and measurement accessory of any of Examples 1 through 5, wherein the at least one of the contacts extending through the hole comprises a sense lead.

Example 7 is the test and measurement accessory of any of Examples 1 through 6, wherein the resistive portion of the shunt comprises one or more resistors painted on a surface of an insulative portion of the shunt.

Example 8 is the test and measurement accessory of any of Examples 1 through 7, wherein the resistive portion of the shunt comprises a plurality of resistors on a flex circuit.

Example 9 is a test and measurement accessory, comprising: a shunt configured to be located in a current path between a busbar and an electronic module and structured to minimize length added to the current path, the shunt having an opening, and a resistive portion comprising a plurality of resistors surrounding an insulative portion; and two or more contacts to allow measurement of a voltage drop across the shunt, at least one of the contacts extending through the opening.

Example 10 is the test and measurement accessory of Example 9, further comprising a top conductive plate coupled to a top of the shunt and a bottom conductive plate coupled to a bottom of the shunt.

Example 11 is the test and measurement accessory of either of Examples 9 or 10, wherein the resistive portion comprises a flex circuit having the plurality of resistors attached.

Example 12 is the test and measurement accessory of any of Examples 9 through 11, wherein the one or more contacts comprise sense leads extending from the flex circuit, one of the sense leads extending through the hole.

Example 13 is the test and measurement accessory of Examples 9 through 12, wherein the resistive portion comprises a ceramic washer having the plurality of resistors attached.

Example 14 is the test and measurement accessory of Examples 9 through 13, further comprising a circuit on an outer surface of the ceramic washer configured to provide connection to the plurality of resistors.

Example 15 is a test and measurement accessory, comprising: a shunt configured to be located in a current path between a busbar and an electronic module and structured to minimize length added to the current path, the shunt comprising a washer having an opening, and a resistive portion; and two or more contacts to allow measurement of a voltage drop across the shunt, at least one of the two or more contacts extending through the opening.

Example 16 is the test and measurement accessory of Example 15, further comprising one of either a conductive gasket or a conductive locking washer within the current path between the shunt and at least one of the busbar and the electronic module.

Example 17 is the test and measurement accessory of either of Examples 15 or 16, wherein the two or more contacts comprise two sense leads, one sense lead in contact with the busbar and one sense lead in contact with the electronic module.

Example 18 is the test and measurement accessory of any of Examples 15 through 17, wherein the resistive portion comprises a resistive material painted on a surface of the washer and in contact with the two or more contacts.

Example 19 is the test and measurement accessory of any of Examples 15 through 17, wherein the two or more contacts have sufficient surface area to provide several different regions for the two or more contacts to contact measurement leads, wherein the several different regions have different sensitivities to magnetic flux from current flowing in the current path.

Example 20 is the test and measurement accessory of Example 19, wherein a particular one of the several regions minimizes magnetic pickup of measurement leads in contact with the two or more contacts at the particular one of the several regions.

All features disclosed in the specification, including the claims, abstract, and drawings, and all the steps in any method or process disclosed, may be combined in any combination, except combinations where at least some of such features and/or steps are mutually exclusive. Each feature disclosed in the specification, including the claims, abstract, and drawings, can be replaced by alternative features serving the same, equivalent, or similar purpose, unless expressly stated otherwise.

Although specific embodiments have been illustrated and described for purposes of illustration, it will be understood that various modifications may be made without departing from the spirit and scope of the disclosure. Accordingly, the invention should not be limited except as by the appended claims.

The invention claimed is:

1. A test and measurement accessory, comprising:
a shunt configured to be located in a current path between a busbar and an electronic module and structured to minimize length added to the current path, the shunt having an opening extending through the shunt, and a resistive portion, the resistive portion configured to form a portion of the current path, the opening extending through the resistive portion; and
two or more contacts to allow measurement of a voltage drop across the shunt, at least one of the contacts extending through the opening and electrically insulated from the resistive portion of the shunt.

2. The test and measurement accessory according to claim 1, further comprising an insulating washer between the shunt and at least one of the two or more contacts.

3. The test and measurement accessory according to claim 2, wherein the insulating washer includes conductive portions that form a pair of voltage sense leads with the two or more contacts.

4. The test and measurement accessory according to claim 1, wherein the at least one of the contacts is insulated from the resistive portion of the shunt by at least one of an insulative portion of the shunt and an air gap.

5. The test and measurement accessory according to claim 1, wherein the at least one of the contacts extending through the hole comprises a bolt of the busbar.

6. The test and measurement accessory according to claim 1, wherein the at least one of the contacts extending through the hole comprises a sense lead.

7. The test and measurement accessory according to claim 1, wherein the resistive portion of the shunt comprises one or more resistors painted on a surface of an insulative portion of the shunt.

8. The test and measurement accessory according to claim 1, wherein the resistive portion of the shunt comprises a plurality of resistors on a flex circuit.

9. A test and measurement accessory, comprising:
a shunt configured to be located in a current path between a busbar and a screw terminal and structured to minimize length added to the current path, the shunt comprising a washer having an opening, and a resistive portion, the opening extending through the resistive portion; and
two or more contacts to allow measurement of a voltage drop across the shunt, at least one of the two or more contacts extending through the opening.

10. The test and measurement accessory according to claim 9, further comprising one of either a conductive gasket or a conductive locking washer within the current path between the shunt and at least one of the busbar and the electronic module.

11. The test and measurement accessory according to claim 9, wherein the two or more contacts comprise two sense leads, one sense lead in contact with the busbar and one sense lead in contact with the electronic module.

12. The test and measurement accessory according to claim 9, wherein the resistive portion comprises a resistive material painted on a surface of the washer and in contact with the two or more contacts.

13. The test and measurement accessory according to claim 9, wherein the two or more contacts have sufficient surface area to provide several different regions for the two or more contacts to contact measurement leads, wherein the several different regions have different sensitivities to magnetic flux from current flowing in the current path.

14. The test and measurement accessory according to claim 13, wherein a particular one of the several regions minimizes magnetic pickup of measurement leads in contact with the two or more contacts at the particular one of the several regions.

* * * * *